(12) United States Patent
Ukei et al.

(10) Patent No.: US 7,713,431 B2
(45) Date of Patent: May 11, 2010

(54) PLASMA PROCESSING METHOD

(75) Inventors: Tomoaki Ukei, Nirasaki (JP); Kimihiro Higuchi, Nirasaki (JP); Tatsuo Matsudo, Nirasaki (JP); Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 213 days.

(21) Appl. No.: 11/147,434

(22) Filed: Jun. 8, 2005

(65) Prior Publication Data
US 2005/0274321 A1 Dec. 15, 2005

Related U.S. Application Data

(60) Provisional application No. 60/589,789, filed on Jul. 22, 2004.

(30) Foreign Application Priority Data
Jun. 10, 2004 (JP) ............................. 2004-172366

(51) Int. Cl.
*H01L 21/00* (2006.01)
(52) U.S. Cl. ........................................ 216/67
(58) Field of Classification Search ............... 438/710; 216/67; 118/723 E; 156/345.47, 915
See application file for complete search history.

(56) References Cited

U.S. PATENT DOCUMENTS

| 5,556,500 | A | * | 9/1996 | Hasegawa et al. | 156/345.27 |
|---|---|---|---|---|---|
| 5,746,928 | A | * | 5/1998 | Yen et al. | 216/37 |
| 5,772,833 | A | * | 6/1998 | Inazawa et al. | 156/345.47 |
| 6,095,084 | A | * | 8/2000 | Shamouilian et al. | 118/723 E |
| 6,432,833 | B1 | * | 8/2002 | Ko | 438/714 |
| 6,676,804 | B1 | * | 1/2004 | Koshimizu et al. | 156/345.53 |
| 6,872,322 | B1 | * | 3/2005 | Chow et al. | 216/67 |
| 2001/0054601 | A1 | * | 12/2001 | Ding | 216/68 |
| 2002/0020494 | A1 | | 2/2002 | Yokogawa et al. | |
| 2004/0005726 | A1 | * | 1/2004 | Huang | 438/14 |
| 2005/0133164 | A1 | * | 6/2005 | Fischer et al. | 156/345.51 |

FOREIGN PATENT DOCUMENTS

| JP | 7-310187 | | 11/1995 |
|---|---|---|---|
| JP | 2000-164583 | | 6/2000 |
| JP | 2001-57363 | | 2/2001 |
| WO | WO9956305 | * | 11/1999 |
| WO | WO0004576 | * | 1/2000 |

* cited by examiner

*Primary Examiner*—Parviz Hassanzadeh
*Assistant Examiner*—Michelle Crowell
(74) *Attorney, Agent, or Firm*—Oblon, Spivak, McClelland, Maier & Neustadt, L.L.P.

(57) ABSTRACT

A plasma processing apparatus for converting a processing gas into a plasma by a high frequency power in a processing chamber and performing a plasma processing on a substrate mounted on a mounting table includes a ring portion disposed to surround the substrate on the mounting table, and a temperature control unit for establishing a temperature difference between the ring portion and the substrate, such that the ring portion is at least 50° C. higher than the substrate. Further, the processing gas generates chlorine radicals, and the temperature control unit is at least one of a heating unit for heating the ring portion and a cooling unit for cooling the mounting table.

3 Claims, 7 Drawing Sheets

PLASMA PROCESSING METHOD

FIELD OF THE INVENTION

The present invention relates to a plasma processing apparatus and a plasma processing method for performing a specified process, e.g., an etching process, on a substrate such as a semiconductor wafer by using plasma.

BACKGROUND OF THE INVENTION

In manufacturing semiconductor devices, in order to separate capacitors or elements, or otherwise to form contact holes, dry etching or film forming process using plasma has been performed on a substrate such as a semiconductor wafer (hereinafter, referred to as a "wafer"). As one of the apparatuses capable of performing such processes, a single wafer parallel plate type plasma processing apparatus is used, wherein a high frequency voltage is applied between an upper electrode and a lower electrode to generate plasma.

FIG. 9 shows a schematic diagram of the above-mentioned plasma apparatus. To describe it briefly, in an sealed chamber 1 which is a vacuum chamber, an upper electrode 11 (also serving as a gas shower head) and a lower electrode 12 (also serving as a substrate mounting table) are, respectively, disposed at an upper side and lower side thereof. A focus ring 13 made of, e.g., quartz is disposed to surround a wafer 100 on the lower electrode 12 (mounting table). An electrostatic chuck 14 which electrostatically attracts and holds the wafer 100 thereon has a foil-shaped electrode 15 therein to which a chuck voltage is applied from a power supply (not shown). Further, a specified processing gas selected according to a process type is discharged onto the wafer 100 from the gas shower head 11 (upper electrode) while simultaneously vacuum pumping the sealed chamber 1 via a vacuum pump 16 to maintain predetermined pressure therein. In the meantime, a high frequency voltage is applied between the upper electrode 11 and the lower electrode 12 from a high frequency power supply 17, whereby the processing gas is converted to plasma so that a specified process such as etching is carried out on the wafer 100.

At this time, after the processing gas discharged from the gas shower head 11 (upper electrode) reaches the vicinity of the surface of the wafer 100, the processing gas is exhausted past and below the periphery of the wafer 100 toward the bottom of the sealed chamber 1. Therefore, a gas flow of the processing gas near the peripheral portion (around the periphery) of the wafer 100 is different from that near the central portion of the wafer 100, thereby resulting in a discrepancy of a predetermined composition ratio in the processing gas between the peripheral portion and the central portion of the wafer 100. Further, parameters like impedance and conductance components between the plasma and the lower electrode 12 of the area where the wafer 100 is disposed are different from those of the outside the area. To elaborate, the dissociation degree of the processing gas is higher in the peripheral portion of the wafer 100 near an exhaust port compared to the central portion of the wafer 100. Since the plasma density is also higher in the peripheral portion of the wafer 100, the etching rate tends to be higher there compared to the central portion.

In response to the strong demands for forming devices even in areas near the periphery of wafer 100, to maximize the utilization of the wafer 100, superior in-surface uniformity of etching rate over the entire wafer surface needs to be achieved. Accordingly, a focus ring 13 formed of a conductor, a semiconductor or a dielectric material etc. is disposed to surround the wafer 100, thereby adjusting the plasma density of the regions above the peripheral portion of the wafer 100. Specifically, a material and an optimum shape of the focus ring 13 are selected according to the type of processing gas, the material type of etched film etc., when selecting a focus ring 13 suitable for the process.

Further, a method has been known for stabilizing plasma processing conditions between wafers such that a protection plate corresponding to the focus ring 13 is coated with a heating element (heater) and provided with a temperature sensor, and a temperature rise caused by the heating element is controlled according to the protection plate's temperature increase due to ion impact, thereby maintaining the protection plate at constant temperature (see, e.g., Reference 1).

[Reference 1] Japanese Patent Laid-open Publication No. H7-310187 (the end of paragraph 0010 and FIG. 5)

However, selection of a processing gas depends upon a film to be etched, and superior in-surface uniformity of a process performed on the entire surface of the wafer 100 is required in response to the recent trend of pattern miniaturization. Due to the uniformity requirement, it is becoming more difficult to choose the optimal material and shape of the focus ring 13 for controlling the plasma density near the peripheral portion of the wafer 100. Therefore, further effort is required to prevent the plasma density near the peripheral portion of the wafer 100 from becoming higher than that over the inner surface thereof.

SUMMARY OF THE INVENTION

It is, therefore, an object of the present invention to provide plasma processing apparatus and method capable of optimizing the plasma state by controlling the temperature difference between a substrate and a ring portion surrounding the substrate, thereby performing a plasma process on the substrate with superior in-surface uniformity.

In accordance with a first aspect of the present invention, there is provided a plasma processing apparatus for converting a processing gas into a plasma by a high frequency power in a processing chamber and performing a plasma processing on a substrate mounted on a mounting table, including a ring portion disposed to surround the substrate on the mounting table; and a temperature control unit for establishing a temperature difference between the ring portion and the substrate, such that the ring portion is at least 50° C. higher than the substrate.

A gas which generates chlorine radicals may be used as the processing gas. Further, the temperature control unit may be at least one of a heating unit for heating the ring portion and a cooling unit for cooling the mounting table.

In accordance with a second aspect of the present invention, there is provided a plasma processing apparatus for converting a processing gas into a plasma by a high frequency power in a processing chamber and performing a plasma processing on a substrate mounted on a mounting table, including a ring portion disposed to surround the substrate on the mounting table; a temperature control unit for establishing a temperature difference between the ring portion and the substrate, such that the ring portion is at least 50° C. higher than the substrate; and a control unit for storing therein temperature differences corresponding to different processes and controlling the temperature control unit to establish a temperature difference suitable for a selected process.

In accordance with a third aspect of the present invention, there is provided a plasma processing method using a plasma processing apparatus having a ring portion disposed to surround a mounting table in a processing chamber, the method including the steps of mounting a substrate on the mounting table; supplying a processing gas in the processing chamber and converting the processing gas into a plasma by a high frequency power to perform a plasma processing on the substrate after the mounting step; and establishing a temperature difference between the ring portion and the substrate, such that the ring portion is at least 50° C. higher than the substrate while the plasma processing is performed on the substrate. A gas which generates chlorine radicals may be used as the processing gas.

In accordance with a fourth aspect of the present invention, there is provided a plasma processing method using a plasma processing apparatus having a ring portion disposed to surround a mounting table in a processing chamber, the method including the following sequential steps of mounting a dummy substrate on the mounting table and generating a plasma under more severe conditions than those in an actual plasma processing which is performed on a product substrate such that temperature of the ring portion is higher than the product substrate in the actual plasma processing, thereby increasing the temperature of the ring portion; replacing the dummy substrate on the mounting table with the product substrate; and supplying a processing gas in the processing chamber and converting the processing gas into a plasma by applying a high frequency power to perform the actual plasma processing on the product substrate.

In accordance with the present invention, the temperature of the ring portion is set to be higher than that of the substrate, whereby the density of active species near the peripheral portion of the substrate is lower than that of active species in the inner region. Accordingly, even though the density of active species near the peripheral portion of the substrate tends to become higher than that of active species in the inner region due to, e.g., the draft of exhausted gas, the temperature difference suppresses it to thereby maintain a lower density difference. As a result, the substrate can be plasma processed with superior in-surface uniformity.

Further, the temperature difference is set according to a process type, whereby the substrate can be processed with superior in-surface uniformity in each process. Moreover, the temperature control unit for establishing the temperature difference becomes unnecessary in the following manner: while using a dummy substrate, a plasma is generated under more severe conditions than those in an actual process which is performed on a product substrate, whereby the temperature of the ring portion is increased, and then the actual process is performed on the product substrate.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
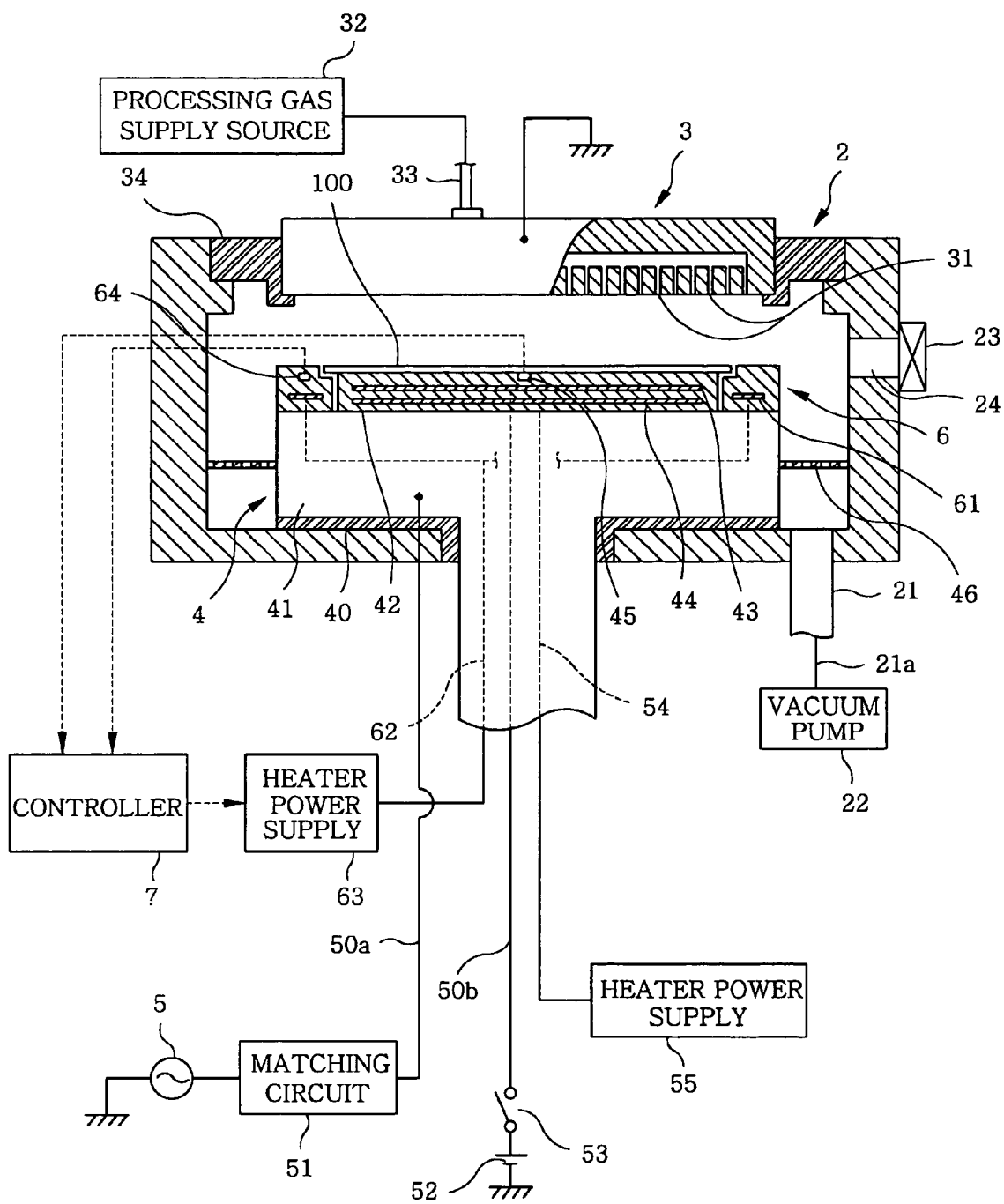
FIG. 1 illustrates a vertical cross section showing a plasma processing apparatus in accordance with a preferred embodiment of the present invention.

A plasma processing apparatus, which is used for an etching apparatus, in accordance with a preferred embodiment of the present invention is described with reference to FIG. 1. A processing chamber 2 is sealed and formed of a conductive material such as aluminum. A gas exhaust port 21 is provided at a bottom portion of the processing chamber 2, and the gas exhaust port 21 is connected to the a vacuum exhaust unit which is a vacuum pump 22 such as a turbo molecular pump or dry pump, via a gas exhaust line 21a. Further, a wafer transfer port 24 having a gate valve 23 which can be opened or closed is formed at a sidewall of the processing chamber 2.

Installed in the processing chamber 2 is an upper electrode 3 also serving as a gas shower head, which is a gas supply unit for introducing a specified processing gas, for example, etching gas, into the processing chamber 2. In a bottom surface of the upper electrode 3, a plurality of gas diffusion holes 31 are formed to supply processing gas coming from a processing gas supply source 32 through a supply line 33 over the entire surface of the wafer 100 disposed under the upper electrode 3. Further, an insulating member 34 made of, for example, quartz is disposed to surround the upper electrode 3, whereby the upper electrode 3 is electrically insulated from the sidewall of the processing chamber 2.

Further, a substrate mounting table 4 (mounting table) is installed to face the upper electrode 3 in the processing chamber 2, and an insulating member 40 may be installed between the substrate mounting table 4 and the processing chamber 2. Further, the substrate mounting table 4 has a support portion 41 (also serving as a lower electrode) of, for example, a cylindrical shape, which is made of a conductive material such as aluminum. A mounting plate 42 for mounting the wafer 100 thereon is disposed on the top surface of the support portion 41. The mounting plate 42 is a dielectric plate made of a dielectric material that is ceramic, for example, aluminum nitride. Disposed inside the mounting plate 42 are a foil shaped electrode 43 (electrostatic chuck electrode) at an upper surface side and a first temperature control unit for controlling temperature of the wafer 100, for example, a heating unit such as a mesh heater 44, at a bottom surface side.

Further, installed in the surface of the mounting plate 42, for instance, a central portion thereof, is a first temperature detector 45, for example, a fluorescent optical fiber thermometer, for detecting the temperature of the wafer 100 placed on the surface of the mounting plate 42. A gas exhaust ring 46 has on the surface thereof a plurality of through holes for uniformly discharging the processing gas from the peripheral portion of the wafer 100 in a circumferential direction. Further, a substrate supporting pin (not shown) capable of being elevated while supporting a bottom surface of the wafer 100 is provided to move up and down from the surface of the substrate mounting table 4. The wafer 100 can be loaded onto the substrate mounting table 4 by operating both a wafer transport arm entering from outside the apparatus and the substrate mounting pin.

One end portion of, e.g., a power feed rod 50a is connected to the support portion 41, i.e., the lower electrode, and the other end portion of the power feed rod 50a is connected to a high frequency power supply 5 via a matching circuit 51. Further, one end portion of, e.g., a power feed rod 50b is connected to the electrostatic chuck electrode 43, and the other end portion of the power feed rod 50b is connected to a DC power supply 52 via a switch 53. That is, the electrostatic chuck electrode 43 and an upper dielectric portion of the mounting plate 42 serve as an electrostatic chuck for electrostatically attracting the wafer 100. Additionally, the heater 44 is connected to a heater power supply 55 via, e.g., a conductive bar 54.

A ring portion for controlling plasma, i.e., a ring member 6 referred to as a focus ring, which is made of an insulating material such as quartz, alumina and yttrium oxide and has a width of its top surface set to, e.g., 55 mm, is installed to surround the wafer 100 which is attracted and held on the surface of the mounting plate 42. A second temperature control unit, for example, a heating unit such as a heater 61, is disposed, for example, along a circumferential direction in the ring member 6. The heater 61 is connected to a heater power supply 63 via, e.g., conductive bar 62. Further, a second temperature detector 64 for detecting temperature of the ring member 6 is installed in a surface side thereof. In this embodiment, the heater 61 is a temperature control unit, which maintains the temperature difference between the wafer 100 and the ring member 6 at or above a certain level, namely, the temperature of the ring member 6 is at least a specified value, e.g., 50° C., above that of the wafer 100 when performing a process on the wafer 100.

It is preferable that the ring member 6 is as close to the outer periphery of the wafer 100 as possible, and a gap between the ring member 6 and the outer periphery of the wafer is not more than, e.g., 1 mm. Further, the surface of the ring member 6 is level with the surface of the wafer 100 or, e.g., 2.5~7 mm higher.

Further, reference numeral 7 in FIG. 1 indicates a controller. The controller 7 has the function of controlling the operation of the high frequency power supply 5, the switch 53, the vacuum pump 55, the substrate supporting pin (not shown), the processing gas supply source 32, the heater power supplies 55 and 63 and the like. The controller 7 including, e.g., a computer (not shown) monitors the temperature difference between the wafer 100 (detected by the temperature detector 45) and the ring member 6 (detected by the temperature detector 64). The controller 7 then controls the temperature of the ring member 6 by using the heater power supply 63 so that the temperature detected from the temperature detector 64 is higher by at least a specified value, e.g., 50° C., than the temperature value detected from the temperature detector 45.

Figure 2A:
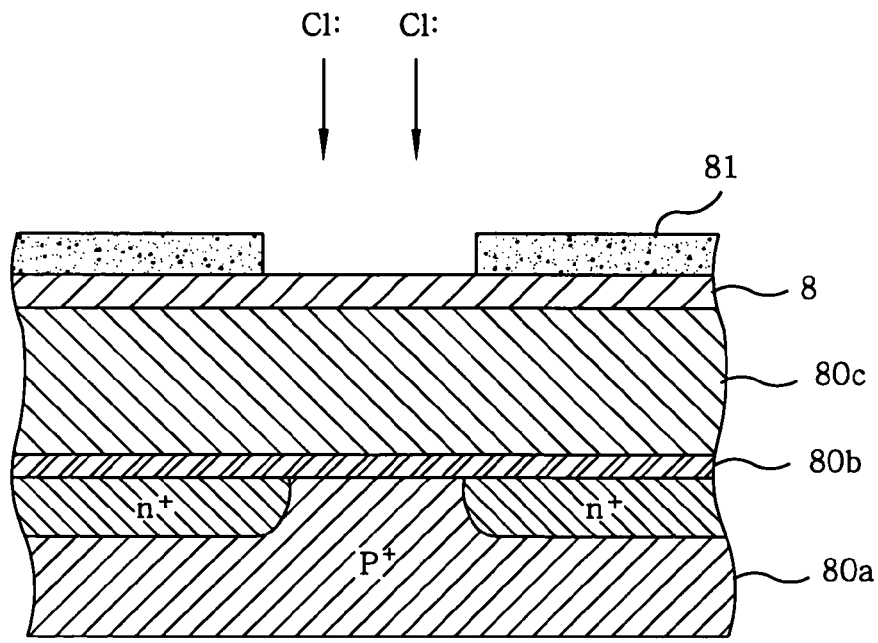
FIGS. 2A and 2B show a vertical cross section of a wafer, which is etched by employing the plasma processing apparatus.
Figure 2B:
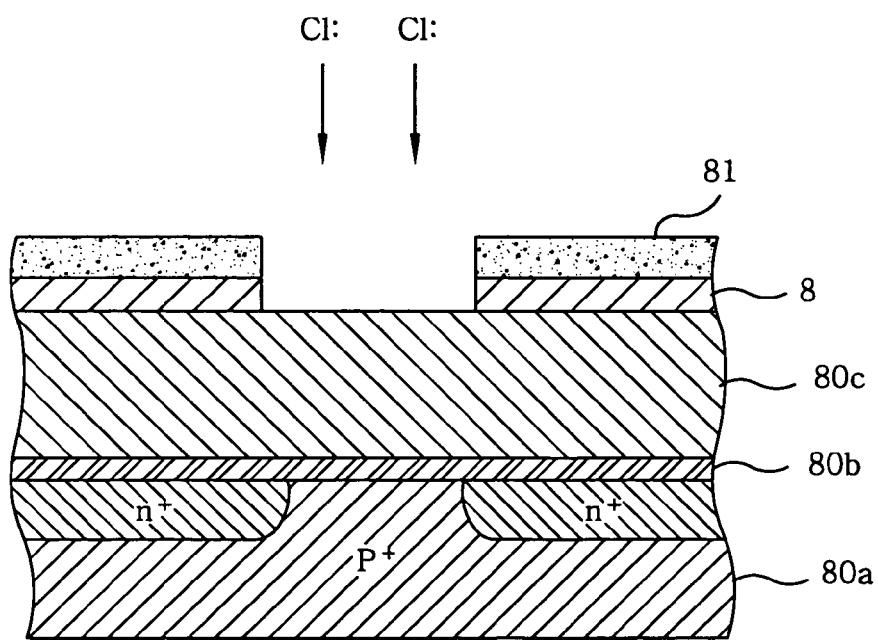

Hereinafter, there will be described a method for etching a substrate, for example, the wafer 100, by using the above-mentioned etching apparatus and, for example, a chlorine-based processing gas. FIGS. 2A and 2B illustrate the process of etching a metal layer (cap layer) 8 of a gate electrode. Reference numerals 80a, 80b and 80b indicate a silicon layer; a gate insulating film made of, e.g., $SiO_2$ film; and a polysilicon layer serving as a gate electrode layer, respectively. The metal layer 8 is layered on a top surface of the polysilicon layer and formed of, e.g., tungsten (W) or tungsten silicide (WSi) layer. A reference numeral 81 indicates a mask pattern (e.g., resist) formed of a specified circuit pattern. As in this embodiment, when plasma active species generated from the chlorine-based gas, for example, chlorine radicals, is mainly used as an etchant (namely, when an etching rate is determined by an etching action of the chlorine radicals), the temperature difference between the wafer 100 and the ring member 6 is set at, e.g., 50° C. or more as defined in the following example.

Further, although this embodiment is exemplified by the generation of the gate electrode as an example of etching the metal layer 8 formed of W or WSi layer, the present invention can also be applied to, for instance, a case where W or WSi layer is etched, the layer forming a metal layer between a wiring layer and an interlayer insulating film. Further, an object to be etched in the present invention, is not limited to W or WSi layer, and can also be, for example, polysilicon.

First, the wafer 100 is loaded into the processing chamber 2 from a load lock chamber (not shown) via a wafer transfer port 24 after the gate valve 23 is opened. Thereafter, the wafer 100 is mounted on the mounting plate 42, which is heated to certain temperature by the heater 44, via a substrate elevating pin (not shown). At this time, the ring member 6 is also heated by the heater 61. Then, a DC voltage serving as chuck voltage is applied to the electrostatic chuck electrode 43 by turning on the switch 53, whereby the wafer 100 is electrostatically attracted to the surface of the mounting plate 42.

The heater 44 is controlled to heat the wafer 100 to temperature at which a plasma processing can be properly performed on the wafer 100, e.g., the temperature at which a specified etching rate can be achieved in the central portion of the wafer 100. But, when the wafer 100 is exposed to the plasma, the wafer 100 gains heat from it. Thus, considering this heating effect from the plasma, the output of the heater 44 is regulated in advance such that the wafer 100 reaches suitable temperature even though the wafer is heated by both plasma and the heater 44. Here, the heat output of the heater 61 is controlled so that the temperature of the ring member 6 is at least 50° C. above that of the wafer 100 (there is minimal temperature distribution in the surface of the wafer 100).

Subsequently, the gate valve 23 is closed to make the processing chamber 2 sealed, and etching gas containing processing gases (e.g., chlorine ($Cl_2$) and oxygen ($O_2$) whose flow rates are set at 150 sccm and 10 sccm, respectively) is discharged over the surface of the wafer 100 through the gas diffusion holes 31. The processing chamber 2 is exhausted to a vacuum at e.g., 5 mTorr~100 mTorr (about 0.67 Pa~13.3 Pa) by the vacuum pump 22. Further, the chlorine gas is used as an etchant and the oxygen gas is added to enhance the formation of a sidewall protection film in this embodiment. The etching gas injected onto the wafer 100 through the gas diffusion holes 31 flows down and is dispersed by forming drafts along radial directions on the surface of the wafer 100, and is exhausted uniformly past the periphery of the substrate mounting table 4 by dispersion action occurring due to ventilation resistance of the exhaust ring 46.

Then, through the matching circuit 51 and the power feed rod 50a, when a high frequency voltage having a frequency of, e.g., 100 MHz and a power level ranging from 250 W to 500 W is applied to the lower electrode 41 from the high frequency power supply 5, a high frequency voltage (high frequency power) is applied between the upper electrode 3 and the wafer 100 on the mounting plate 42 to convert etching gas into plasma, thereby generating plasma active species, e.g., chlorine radicals, which works as an etchant. At this time, because of a temperature difference of, e.g., 50° C. between the wafer 100 and the ring member 6, the regions near the surfaces thereof also display a temperature difference corresponding to the different between the wafer 100 and the ring member 6 (but in fact, the temperature difference between the regions is not 50° C. because of a low thermal conductivity inside the processing chamber 2 that has been exhausted to a vacuum and also due to heat from the plasma). Consequently, as the temperature of the region near the surface of the ring member 6 is higher than that near the surface of wafer 100, the gas density near the surface of the ring member 6 becomes lower than that of the inner region. Active species in the plasma are thrusted onto the surface of the wafer 100, and the metal film 8 is etched through the resist 81 while the film being etched more selectively over the resist (see FIG. 2B).

Thereafter, for example, when a specified time elapses, the application of the high frequency voltage from the high frequency power supply 5 and introduction of etching gas are stopped, and the vacuum exhaust performed by the vacuum pump 22 is stopped while nonreactive gas such as nitrogen is introduced into the processing chamber 2 from, e.g., a gas supply unit (not shown). Then, the switch 53 is converted to stop applying the chuck voltage, whereby the wafer 100 is then no longer attracted thereto. Finally, the gate valve 23 is opened and the wafer 100 is unloaded from the apparatus, whereby the etching process is completed.

Figure 3A:
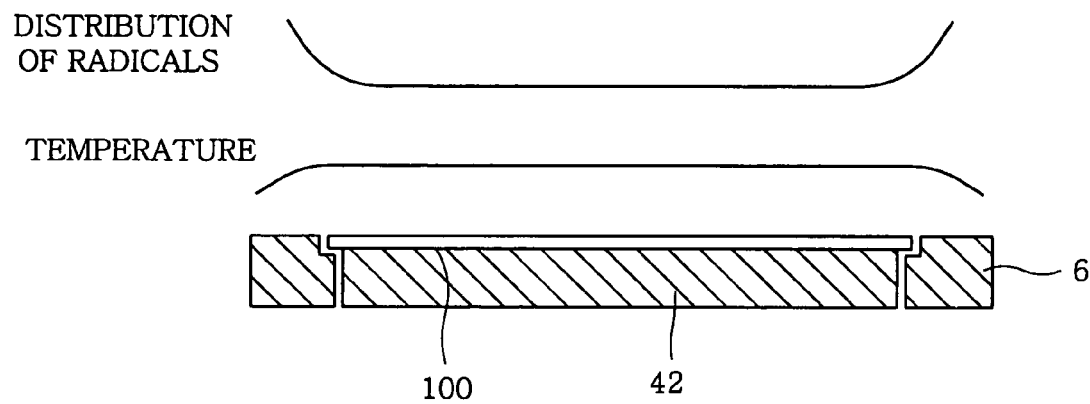
FIGS. 3A and 3B schematically show the distribution of radicals and the temperature profile near the surface of the wafer.
Figure 3B:
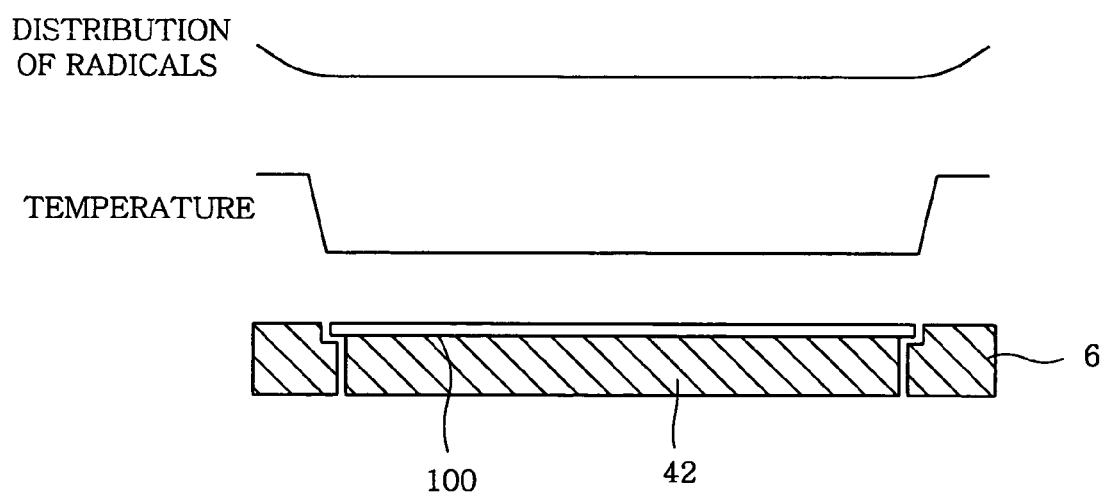

In accordance with the above-mentioned embodiment, the temperature of the surface of the wafer 100 is set to be higher than that of the surface of the ring member 6, whereby the temperature of the plasma atmosphere near the surface of the ring member 6 (that is, the peripheral portion of the wafer 100) is higher than that of the inner region. Thus, the density of active species near the peripheral portion of the wafer 100 is lower than that of active species in the inner region. Accordingly, for example, the draft of exhausted gas promotes a dissociation of the gas species near the peripheral portion. If the temperature difference is not controlled, a radical density is higher near the peripheral portion as shown in FIG. 3A. In the prevent invention, the temperature difference is controlled to adjust the density profile of the active species such that the higher radical density near the peripheral portion is suppressed as shown in FIG. 3B. As a result, the wafer 100 can be etched with superior in-surface uniformity. It should be noted that, for simplicity, the electrode 43, the heaters 44 and 61, the temperature detectors 45 and 64 are omitted in FIGS. 3A and 3B.

Figure 4:
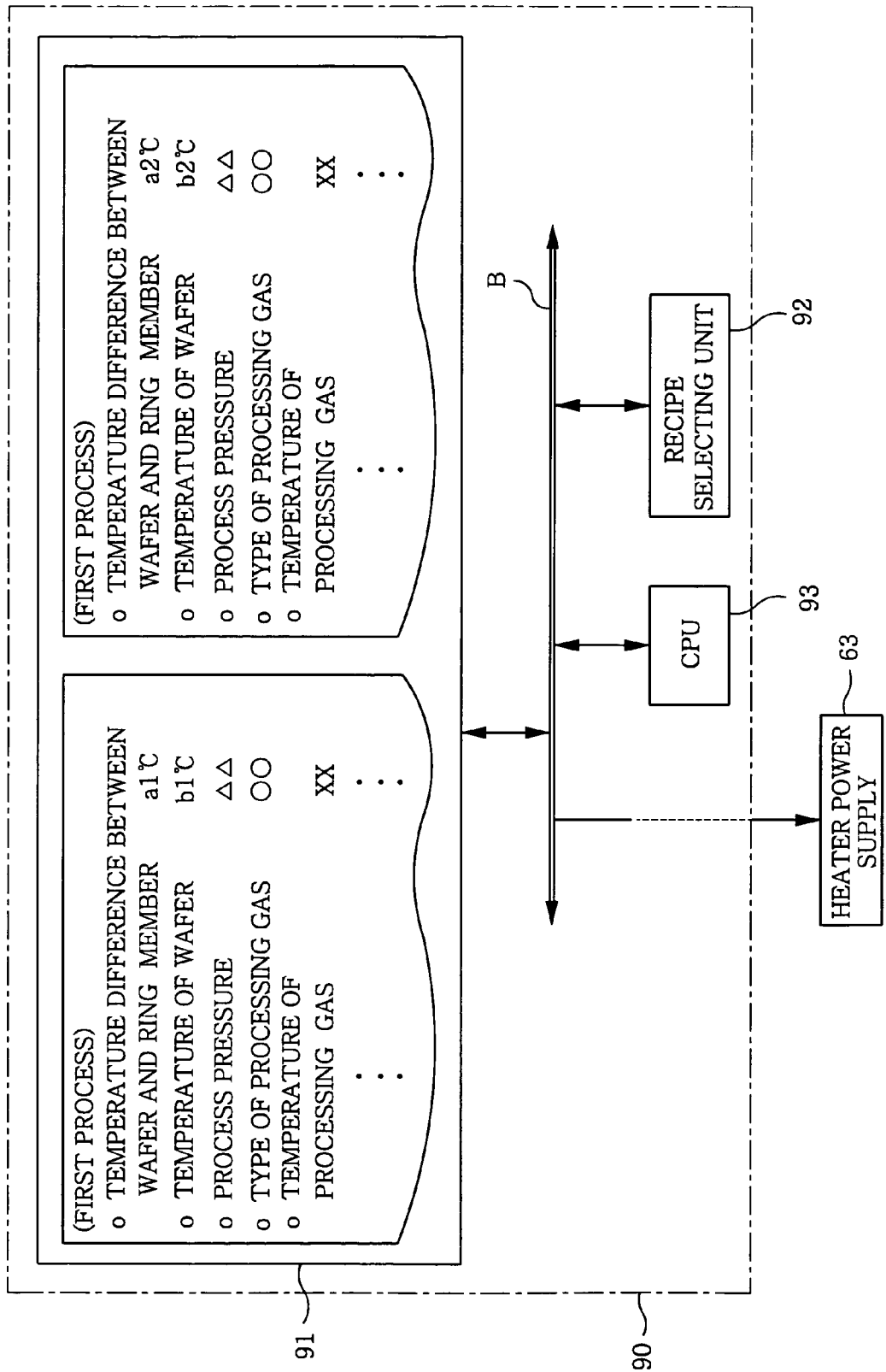
FIG. 4 offers another example of a controller included in the plasma processing apparatus.

Moreover, when different kinds of processes are performed on the wafer 100 by using different types of processing gases, the following configuration is possible. That is, for instance, as depicted in FIG. 4, the controller 7 is provided with a computer 90 and a plurality of process recipes are stored in a storage unit 91, e.g., memory, of the computer 90. Stored in each of the process recipes are process conditions corresponding to, e.g., a kind of film to be etched on the surface of a wafer 100, i.e., information of set values such as a temperature difference between the wafer 100 and the ring member 6; process pressure; temperature of wafer 100; type, temperature and supply flow rate of etching gas. A reference numeral 92 indicates a recipe selecting unit which allows, for example, an operator to select a process recipe corresponding to a type of film to be etched. For simplicity, only the first and the second process are shown, but the process recipes may be prepared corresponding to a third process, a fourth process and so on as required. In this case, process conditions, i.e., set values such as a temperature difference between the wafer 100 and the ring member 6 are determined for each process.

Based on the information of a selected process recipe, the temperature of the ring member 6 is controlled by, e.g., the heater power supply 63 such that a specified temperature difference is established between temperature values detected from the temperature detectors 64 and 45. The heater 44 for heating the mounting plate 42A is used for setting process temperature of the wafer 100. But, for example, when the tolerance range for the set value is large, the temperature difference may be set by controlling heat outputs of both the heaters 61 and 44 or by controlling the heat output of the heater 44 instead of the heater 61. Moreover, reference numerals 93 indicated a CPU and B a bus. In accordance with the present embodiment, a plurality of different processes can be performed with a temperature difference suitable for each process, whereby a density of active species can be more elaborately controlled. That is, the wafer 100 can be processed with a superior in-surface uniformity in each process.

Hereinafter, there will be described a plasma processing apparatus, which is used for an etching apparatus, in accordance with another embodiment of the present invention with reference to FIG. 5. The etching apparatus of this embodiment does not include the heater 61 for heating the ring member 6 and has the same configuration as that of the apparatus shown in FIG. 1 except that it performs a preliminary heating to be described later in order to establish a specified temperature difference between the wafer 100 and the ring member 6 (parts that are already described above will be assigned same reference numerals, and detailed description thereof will be omitted).

In the preliminary heating, before a process is performed on a product substrate, i.e., a process wafer (the wafer 100), a process is performed on a dummy substrate, i.e., a dummy wafer formed of, for example, a bare wafer, whereby temperature of the ring member 6 is controlled at a specified temperature. Specifically, plasma is generated under more severe conditions than those in a process which is performed on the product substrate, i.e., the process wafer. For example, compared with an actual process, a high frequency voltage of a higher power is applied to the lower electrode 41 from the high frequency power supply 5 to thereby generate plasma at a higher temperature. Thus, temperatures of the members in the processing chamber 2, which are exposed to the plasma, are increased and the temperature of the ring member 6 is also raised.

The temperature of the ring member 6 is increased until a specified temperature difference is established between the temperature of the ring member 6 and a set temperature of the process wafer in the actual process. That is, if this scheme is applied to the above embodiment, wherein the set temperature value of the wafer 100 in a process is, e.g., 76° C. and the temperature difference is 50° C. or more, the temperature of the ring member 6 is increased up to 126° C. or higher. Thereafter, a high frequency voltage is set at the process condition, and the process wafer is loaded in the apparatus and etching process is performed thereon instead of the dummy wafer. Such a configuration can also provide the same effect as in the aforementioned embodiment. Moreover, in accordance with the present embodiment, the temperature control unit for establishing the temperature difference becomes unnecessary.

Further, although a temperature difference is estasblished by heating the ring member 6 in the present embodiment, the present invention is not limited thereto and can have a configuration, wherein a temperature difference may be formed by a cooling unit for cooling the wafer 100, for example, Peltier element, provided instead of the heater 44 in the mounting plate 42. In this case, the temperature of the wafer 100 may be adjusted by the cooling unit such that the specified temperature difference is established between the wafer 100 and the ring member 6 whose temperature is set at a specified value by the heater 61 or increased by heating from the plasma without being heated by the heater 61. By employing such a configuration, the same effect as in the above-described preferred embodiment can be obtained.

Hereinafter, examples perform to demonstrate the effect of the present invention.

EXAMPLE 1

Figure 5:
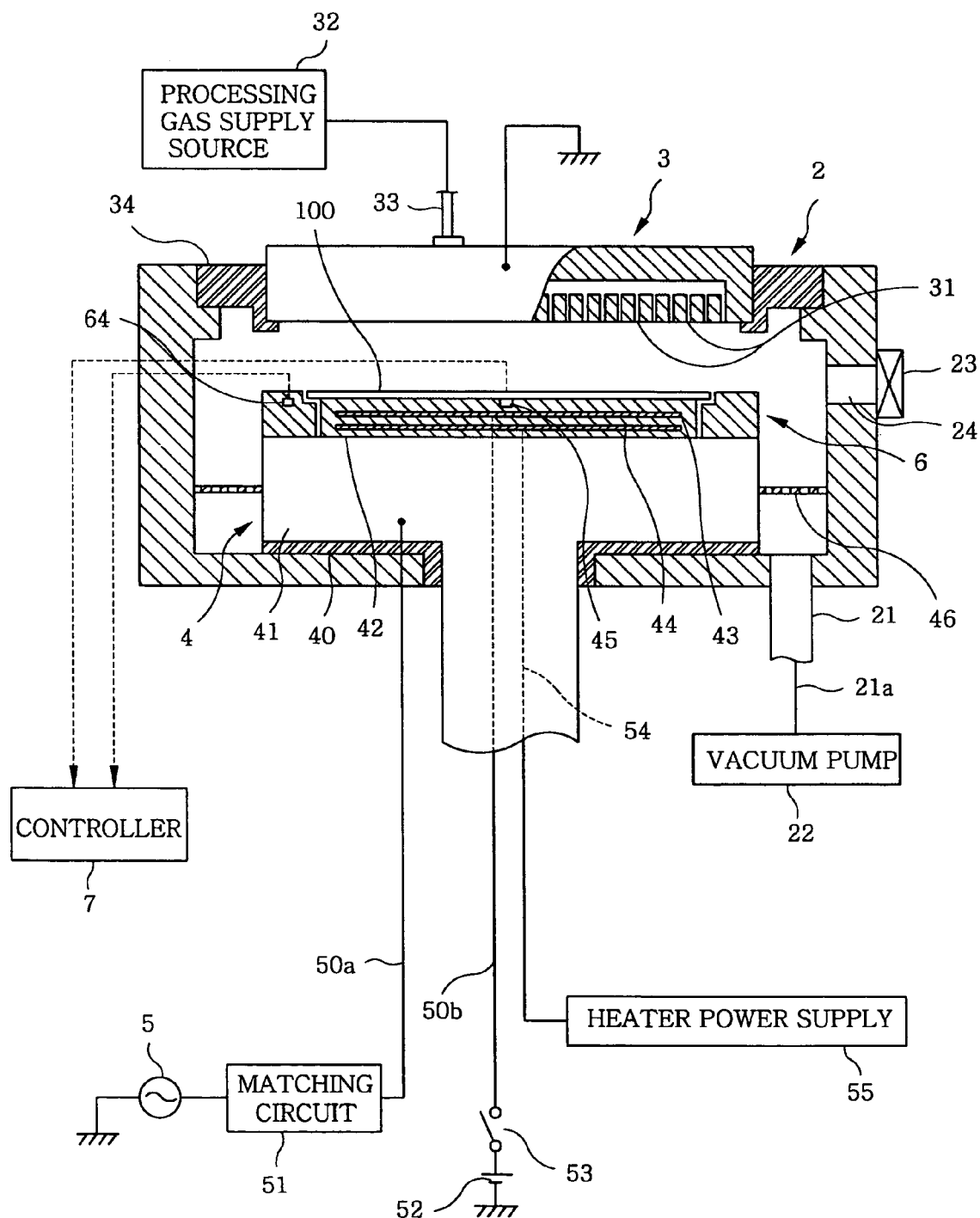
FIG. 5 presents a vertical cross section showing a plasma processing apparatus in accordance with another preferred embodiment of the present invention.
Figure 6:
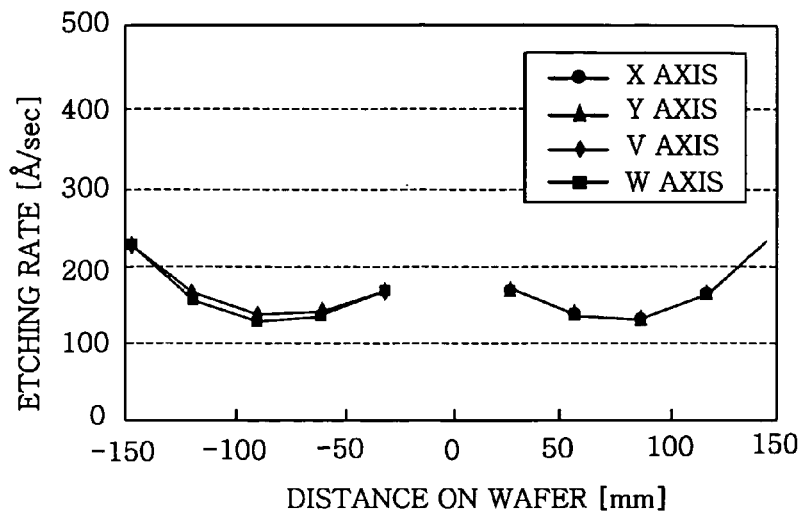
FIG. 6 is a chart that shows the effect of the present invention by plotting the results of an example.

In this example, the above-mentioned preliminary heating is performed by using the apparatus shown in FIG. 5 while a temperature difference of 50° C. is established between the wafer 100 and the ring member 6. Specific process conditions will be listed below. The film thicknesses of the wafer 100 before and after an etching process are measured at intervals along the respective axes of X axis, Y axis, V axis and W axis equally spaced apart, intersecting at the center of wafer 100. FIG. 6 shows etching rates obtained by calculation at respective measurement points.

Object to be etched: tungsten silicide
Etching gas: $Cl_2$ (150 sccm) and $O_2$ (10 sccm)
Pressure: 5 mTorr
HF/LF power (for generating plasma/for bias): 250 W/200 W
Magnetic field intensity: 56 G
Temperature difference: 50° C. (temperature of ring member 6=126° C., temperature of wafer 100=76° C.)

COMPARISON EXAMPLE 1

Figure 7:
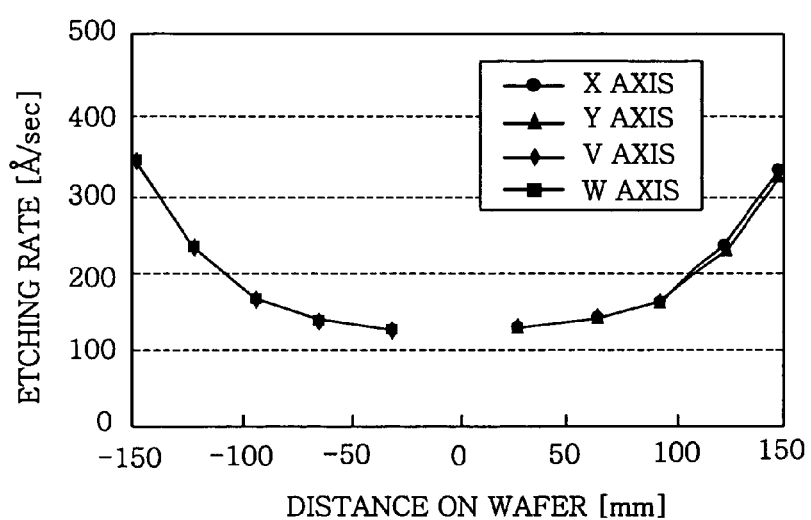
FIG. 7 is a chart that shows the effect of the present invention by plotting the results of a comparison example.

In this example, the same process as in Example 1 is performed except that a temperature difference of 5° C. is established between the ring member 6 and the wafer 100 by setting the temperature of the ring member 6 at 81° C. FIG. 7 shows calculated etching rates.

COMPARISON EXAMPLE 2

Figure 8:
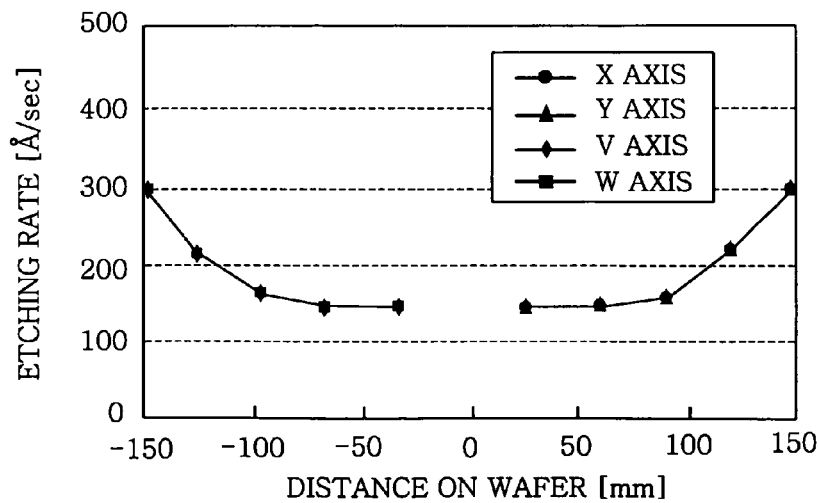
FIG. 8 is a chart that shows the effect of the present invention by plotting the results of another comparison example.
Figure 9:
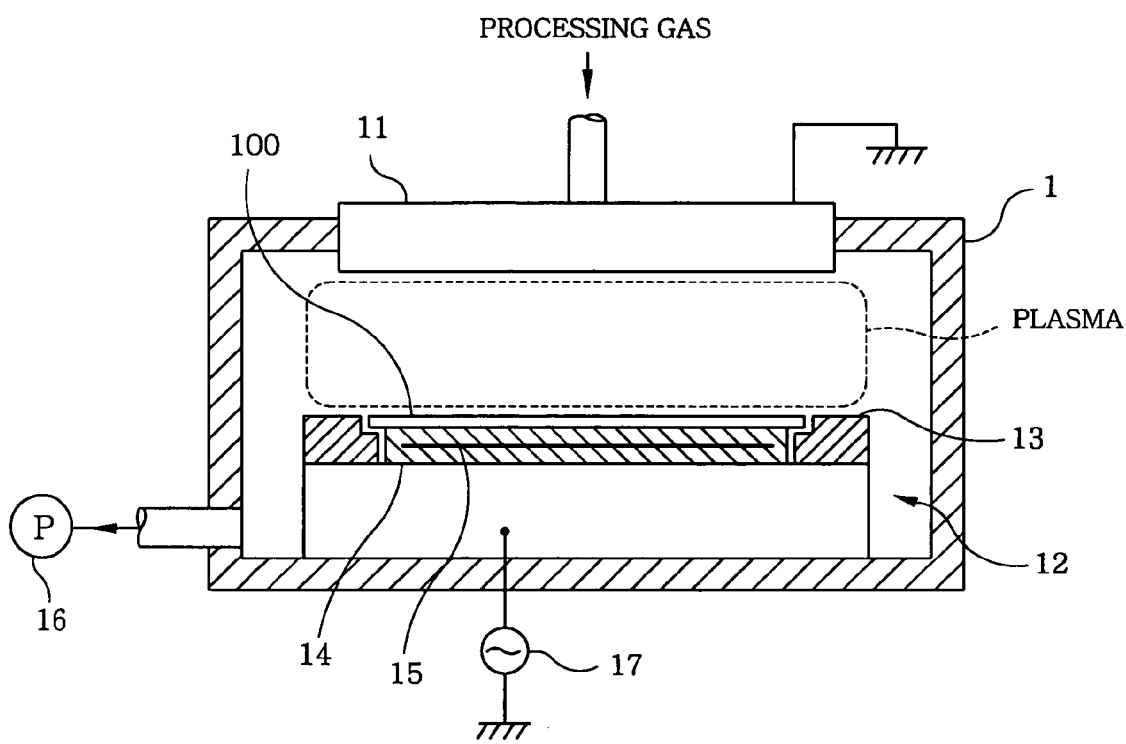
FIG. 9 shows a conventional plasma processing apparatus.

In this example, the same process as in Example 1 is performed except that a temperature difference of 17° C. is established between the ring member 6 and the wafer 100 by setting the temperature of the ring member 6 at 93° C. FIG. 8 shows calculated etching rates.

(results of Example 1 and Comparison examples 1 and 2 and study thereof)

From the results reported in FIGS. 6 to 8, the following conclusion can be deduced. In Example 1, a variation of EE 3 mm is ±27.38% and a variation of EE 30 mm is ±13.5%. Whereas in Comparison 1, a variation of EE 3 mm is ±46.39% and a variation of EE 30 mm is ±29.8%. Further, in Comparison 2, a variation of EE 3 mm is ±32.88% and a variation of EE 30 mm is ±17.38%. Here, EE 3 mm indicates an average of measured values of an area extending over 3 mm inwardly from an edge portion of the wafer 100, and EE 30 mm indicates an average of measured values of an area extending over 30 mm inwardly therefrom. Accordingly, Comparison example 1, wherein a small temperature difference is established between the ring member 6 and the wafer 100, has the biggest increase in the etching rates, whereas Example 1, wherein a large temperature difference is established between the ring member 6 and the wafer 100, has the smallest increase in the etching rates. In other words, an increase in the etching rates is particularly suppressed by establishing a temperature difference of 50° C.

As seen from the above results, an increase of the etching rates in the peripheral portion of the wafer 100 can be particularly suppressed by establishing a temperature difference of 50° C. between the wafer 100 and the ring member 6. Further, an increase in the etching rates becomes smaller as the temperature difference is greater. Therefore, if a temperature difference is set to be equal to or more than 50° C., it is possible to suppress an increase in the etching rates.

While the invention has been shown and described with respect to the preferred embodiments, it will be understood by those skilled in the art that various changes and modifications may be without departing from the spirit and scope of the invention as defined in the following claims.

What is claimed is:

1. A plasma processing method using a plasma processing apparatus including a ring portion disposed to surround a mounting table in a processing chamber, the method comprising the following sequential steps of:

mounting a dummy substrate on the mounting table and generating a plasma under more severe conditions than those during an actual plasma process which is performed on a product substrate including a tungsten or tungsten silicide layer to increase temperature of the ring portion such that the temperature of the ring portion is higher than that of the product substrate during the actual plasma process;

replacing the dummy substrate on the mounting table with the product substrate; and supplying a chlorine-based processing gas in the processing chamber and generating chlorine radicals from the chlorine-based processing gas by applying a high frequency power to etch the tungsten or tungsten suicide layer while the temperature of the ring portion is higher than that of the product substrate due to heat retained from the plasma under more severe conditions.

2. The plasma processing method of claim 1, wherein in generating the chlorine radicals under said more severe conditions, a high frequency voltage of a power level higher than the high frequency power during the etching process is applied to generate the chlorine radicals.

3. The plasma processing method of claim 1, wherein in generating the chlorine radicals under said more severe conditions, the temperature of the ring portion is increased to be at least 50° C. higher than that of the product substrate during the etching process.

* * * * *